(12) United States Patent
Tamura et al.

(10) Patent No.: US 11,088,290 B2
(45) Date of Patent: Aug. 10, 2021

(54) SEMICONDUCTOR APPARATUS

(71) Applicant: FUJI ELECTRIC CO., LTD., Kanagawa (JP)

(72) Inventors: Takahiro Tamura, Matsumoto (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/773,878

(22) Filed: Jan. 27, 2020

(65) Prior Publication Data

US 2020/0161479 A1     May 21, 2020

Related U.S. Application Data

(63) Continuation of application No. PCT/JP2018/043078, filed on Nov. 21, 2018.

(30) Foreign Application Priority Data

Feb. 16, 2018    (JP) .............................. JP2018-026036

(51) Int. Cl.
| | |
|---|---|
| *H01L 29/861* | (2006.01) |
| *H01L 27/07* | (2006.01) |
| *H01L 29/06* | (2006.01) |
| *H01L 29/36* | (2006.01) |
| *H01L 29/417* | (2006.01) |
| *H01L 29/739* | (2006.01) |

(52) U.S. Cl.
CPC ........ *H01L 29/861* (2013.01); *H01L 27/0716* (2013.01); *H01L 29/0623* (2013.01);
(Continued)

(58) Field of Classification Search
CPC .............. H01L 29/861; H01L 27/0716; H01L 29/0623; H01L 29/0684; H01L 29/36;
(Continued)

(56) References Cited

U.S. PATENT DOCUMENTS

| | | |
|---|---|---|
| 9,496,332 B1 | 11/2016 | Matsushita |
| 10,374,102 B2 | 8/2019 | Onozawa |

(Continued)

FOREIGN PATENT DOCUMENTS

| | | |
|---|---|---|
| JP | 2008235590 A | 10/2008 |
| JP | 2009043924 A | 2/2009 |

(Continued)

OTHER PUBLICATIONS

International Search Report and (ISA/237) Written Opinion of the International Search Authority for International Patent Application No. PCT/JP2018/043078, mailed by the Japan Patent Office dated Feb. 5, 2019.

*Primary Examiner* — Shahed Ahmed

(57) ABSTRACT

Provided is a semiconductor apparatus in which the buried region includes an end portion buried region continuously disposed from a region below the contact opening up to a region below the interlayer dielectric film while passing below an end portion of the contact opening in a cross section perpendicular to the upper surface of the semiconductor substrate, and the end portion buried region disposed below the interlayer dielectric film is shorter than the end portion buried region disposed below the contact opening in a first direction in parallel with the upper surface of the semiconductor substrate.

12 Claims, 7 Drawing Sheets

(52) U.S. Cl.
CPC .......... *H01L 29/0684* (2013.01); *H01L 29/36* (2013.01); *H01L 29/417* (2013.01); *H01L 29/7396* (2013.01)

(58) Field of Classification Search
CPC . H01L 29/417; H01L 29/7396; H01L 29/083; H01L 29/32; H01L 29/0619; H01L 29/8611; H01L 29/0646; H01L 29/78; H01L 29/7833–836; H01L 27/0823–0828; H01L 29/66333–66348; H01L 29/732–7327; H01L 29/7371–7378; H01L 29/7395–7398
See application file for complete search history.

(56) References Cited

U.S. PATENT DOCUMENTS

| | | | | |
|---|---|---|---|---|
| 2015/0364613 A1* | 12/2015 | Onozawa | ............. | H01L 21/225 257/481 |
| 2016/0027866 A1* | 1/2016 | Yoshikawa | ......... | H01L 29/0623 257/484 |
| 2016/0365250 A1* | 12/2016 | Matsui | ................ | H01L 21/2253 |
| 2019/0172715 A1* | 6/2019 | Zanetti | ................ | H01L 29/0619 |

FOREIGN PATENT DOCUMENTS

| | | | |
|---|---|---|---|
| JP | 2012119716 A | 6/2012 |
| JP | 2017050421 A | 3/2017 |
| WO | 2014156849 A1 | 10/2014 |

\* cited by examiner

SEMICONDUCTOR APPARATUS

The contents of the following Japanese patent application(s) are incorporated herein by reference:
NO. 2018-026036 filed in JP on Feb. 16, 2018, and
NO. PCT/JP2018/043078 filed on Nov. 21, 2018.

BACKGROUND

1. Technical Field

The present invention relates to a semiconductor apparatus.

2. Related Art

Up to now, a semiconductor apparatus has been proposed in which an opening for contact is disposed in an insulating film on a semiconductor substrate, and the semiconductor substrate and an anode electrode are connected to each other (for example, see PTL 1).
PTL 1: International Publication No. 2014/156849

Since a current tends to concentrate in an end portion of a contact opening, the current crowding is preferably relaxed.

(Article 1) To address the above-described issue, according to an aspect of the present invention, there is provided a semiconductor apparatus including a semiconductor substrate in which a drift region having a first conductive type is disposed. The semiconductor apparatus may include an anode region having a second conductive type which is disposed between an upper surface of the semiconductor substrate and the drift region. The semiconductor apparatus may include a cathode region having the first conductive type which is disposed between a lower surface of the semiconductor substrate and the drift region and has a higher doping concentration than the drift region. The semiconductor apparatus may include a buried region having the second conductive type which is disposed above the cathode region. The semiconductor apparatus may include an interlayer dielectric film which is arranged above the upper surface of the semiconductor substrate and in which a contact opening for exposing a part of the anode region is disposed. The semiconductor apparatus may include an upper surface side electrode in contact with the anode region in the contact opening. The buried region may include an end portion buried region continuously disposed from a region below the contact opening up to a region below the interlayer dielectric film while passing below an end portion of the contact opening in a cross section perpendicular to the upper surface of the semiconductor substrate. The end portion buried region disposed below the interlayer dielectric film may be shorter than the end portion buried region disposed below the contact opening in a first direction in parallel with the upper surface of the semiconductor substrate.

(Article 2) A length of the end portion buried region disposed below the interlayer dielectric film in the first direction may be 20 µm or longer.

(Article 3) The buried region may be separated in the first direction and disposed at an interval of a predetermined slit width. The length of the end portion buried region disposed below the interlayer dielectric film in the first direction may be larger than the slit width.

(Article 4) The anode region may be disposed from the region below the contact opening up to the region below the interlayer dielectric film while passing below the end portion of the contact opening in the cross section perpendicular to the upper surface of the semiconductor substrate. The end portion buried region disposed below the interlayer dielectric film may be shorter than the anode region disposed below the interlayer dielectric film in the first direction.

(Article 5) The cathode region may be disposed from the region below the contact opening up to the region below the interlayer dielectric film while passing below the end portion of the contact opening in the cross section perpendicular to the upper surface of the semiconductor substrate. The end portion buried region disposed below the interlayer dielectric film may be shorter than the cathode region disposed below the interlayer dielectric film in the first direction.

(Article 6) The end portion buried region disposed below the interlayer dielectric film may be shorter than the cathode region disposed below the interlayer dielectric film by 10 µm or more in the first direction.

(Article 7) The anode region and the cathode region may be disposed from the region below the contact opening up to the region below the interlayer dielectric film while passing below the end portion of the contact opening in the cross section perpendicular to the upper surface of the semiconductor substrate. The cathode region disposed below the interlayer dielectric film may be shorter than the anode region disposed below the interlayer dielectric film in the first direction.

(Article 8) A length in the cathode region disposed below the interlayer dielectric film may be half or more of a length in the anode region disposed below the interlayer dielectric film in the first direction.

(Article 9) A distance between an end portion of the cathode region and an end portion of the anode region in the first direction may be larger than a thickness of the anode region in a second direction perpendicular to the upper surface of the semiconductor substrate.

(Article 10) The distance between the end portion of the cathode region and the end portion of the anode region in the first direction may be larger than a thickness of the interlayer dielectric film in the second direction perpendicular to the upper surface of the semiconductor substrate.

(Article 11) The anode region may include a curved section in the end portion in the cross section perpendicular to the upper surface of the semiconductor substrate. A configuration may be adopted in which the cathode region is not disposed below the curved section.

(Article 12) The length of the end portion buried region disposed below the contact opening may be equal to or larger than a thickness of the semiconductor substrate in the first direction.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described by way of embodiments, but the following embodiments are not intended to limit the invention described in the scope of the invention. In addition, not all combinations of features described in the embodiments necessarily have to be essential to solving means of the invention.

According to the present specification, one side in a direction parallel to a depth direction of a semiconductor substrate is referred to as an "upper" side, and the other side is referred to as a "lower" side. One surface of two principal surfaces of a substrate, a layer, or other components is referred to as an upper surface, and the other surface is referred to as a lower surface. The "upper" and "lower" directions are not limited to the gravitational direction or an attachment direction at the time of mounting of the semiconductor apparatus to the substrate or the like.

According to the present specification, technical matters may be described using orthogonal coordinate axes of an X axis, a Y axis, and a Z axis in some cases. According to the present specification, a plane in parallel with an upper surface of the semiconductor substrate is set as an XY plan, and the depth direction perpendicular to the upper surface of the semiconductor substrate is set as the Z axis.

According to the respective embodiments, examples are illustrated where a first conductivity type is set as an n type, and a second conductivity type is set as a p type, but the first conductivity type may also be set as the p type, and the second conductivity type may also be set as the n type. In this case, conductivity types of a substrate, a layer, a region, and the like according to the respective embodiments are respectively set as opposite polarities. In addition, in a case where a p+ type (or an n+ type) is described in the present specification, it means that a doping concentration is higher than the p type (or the n type), and in a case where a p− type (or an n− type) is described, it means that the doping concentration is lower than the p type (or the n type).

The doping concentration in the present specification refers to a concentration of impurities transformed to donors or acceptors. In the present specification, a difference between concentrations of donors and acceptors may be set as the doping concentration (also referred to as a net doping concentration or a carrier concentration) in some cases. In addition, a peak value of a doping concentration distribution in a doping region may be set as the doping concentration in the doping region in some cases.

Figure 1:
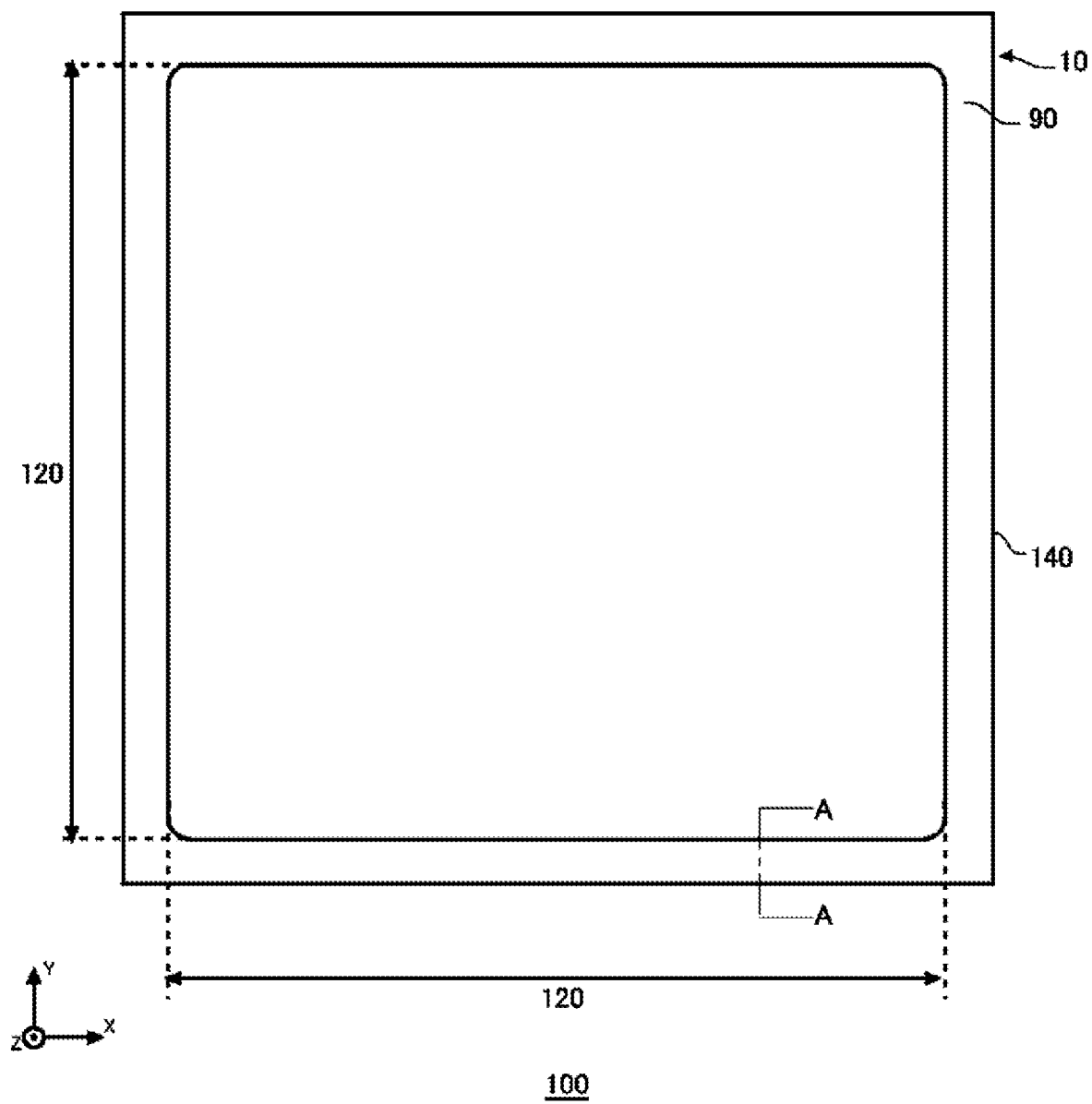
FIG. 1 is a drawing illustrating a structure of an upper surface of a semiconductor apparatus 100 according to an embodiment of the present invention.

FIG. 1 is a drawing illustrating a structure of an upper surface of a semiconductor apparatus 100 according to an embodiment of the present invention. The semiconductor apparatus 100 includes a semiconductor substrate 10. The semiconductor substrate 10 may be a silicon substrate, may be a silicon carbide substrate, or may also be a nitride semiconductor substrate such as gallium nitride, or the like. The semiconductor substrate 10 in this example is a silicon substrate. According to the present specification, an end portion on an outer circumference of the semiconductor substrate 10 in a top view is set as an outer circumferential end 140. The top view refers to a case where observation in parallel with the Z axis from an upper surface side of the semiconductor substrate 10 is performed.

The semiconductor apparatus 100 includes an active portion 120 and an edge terminal structure portion 90. The active portion 120 is a region where a main current flows between the upper surface and a lower surface of the semiconductor substrate 10 in a case where the semiconductor apparatus 100 is controlled to be in an ON state. That is, the active portion 120 is a region where the current flows inside the semiconductor substrate 10 in a depth direction from the upper surface to the lower surface of the semiconductor substrate 10, or from the lower surface to the upper surface. The active portion 120 can also be set as a region where an upper surface side electrode in which the main current flows such as an anode electrode is disposed in the top view of the semiconductor substrate 10. In addition, in a case where the upper surface side electrode is separated in the top view of the semiconductor substrate 10, a region sandwiched by regions where the two upper surface side electrodes are disposed may also be included in the active portion 120. The upper surface side electrode may be in contact with the upper surface of the semiconductor substrate 10 in the entire active portion 120, or may also be partially in contact with the upper surface of the semiconductor substrate 10.

A diode portion including a diode device such as a freewheeling diode (FWD) is disposed in the active portion 120. A transistor portion including a transistor device such as an insulated gate bipolar transistor (IGBT) may also be further disposed in the active portion 120. A p type anode region of the diode portion and an n type emitter region of the transistor portion may be connected to the common upper surface side electrode, and an n type cathode region of the diode portion and a p type collector region of the transistor portion may be connected to the common lower surface side electrode. The diode portion and the transistor portion may be disposed in a striped pattern lengthening in a Y axis direction in the XY plane. The diode portion and the transistor portion may be alternately disposed in an X axis direction in the XY plane.

The edge terminal structure portion 90 is disposed on the upper surface of the semiconductor substrate 10 between the active portion 120 and the outer circumferential end 140 of the semiconductor substrate 10. The edge terminal structure portion 90 may be disposed on the upper surface of the semiconductor substrate 10 in an annular pattern to surround the active portion 120. The edge terminal structure portion 90 in this example is arranged along the outer circumferential end 140 of the semiconductor substrate 10. The edge terminal structure portion 90 relaxes electric field concentration on the upper surface side of the semiconductor substrate 10. The edge terminal structure portion 90 has a structure of a guard ring, a field plate, RESURF, or a combination thereof, for example.

In addition, in a case where the transistor portion is disposed in the active portion 120, a gate metallic layer may be disposed on the upper surface of the semiconductor substrate 10 between the edge terminal structure portion 90 and the active portion 120. The gate metallic layer may be disposed to surround the active portion 120 in the top view of the semiconductor substrate 10. The gate metallic layer is electrically connected to the transistor portion and supplies a gate voltage to the transistor portion.

Figure 2:
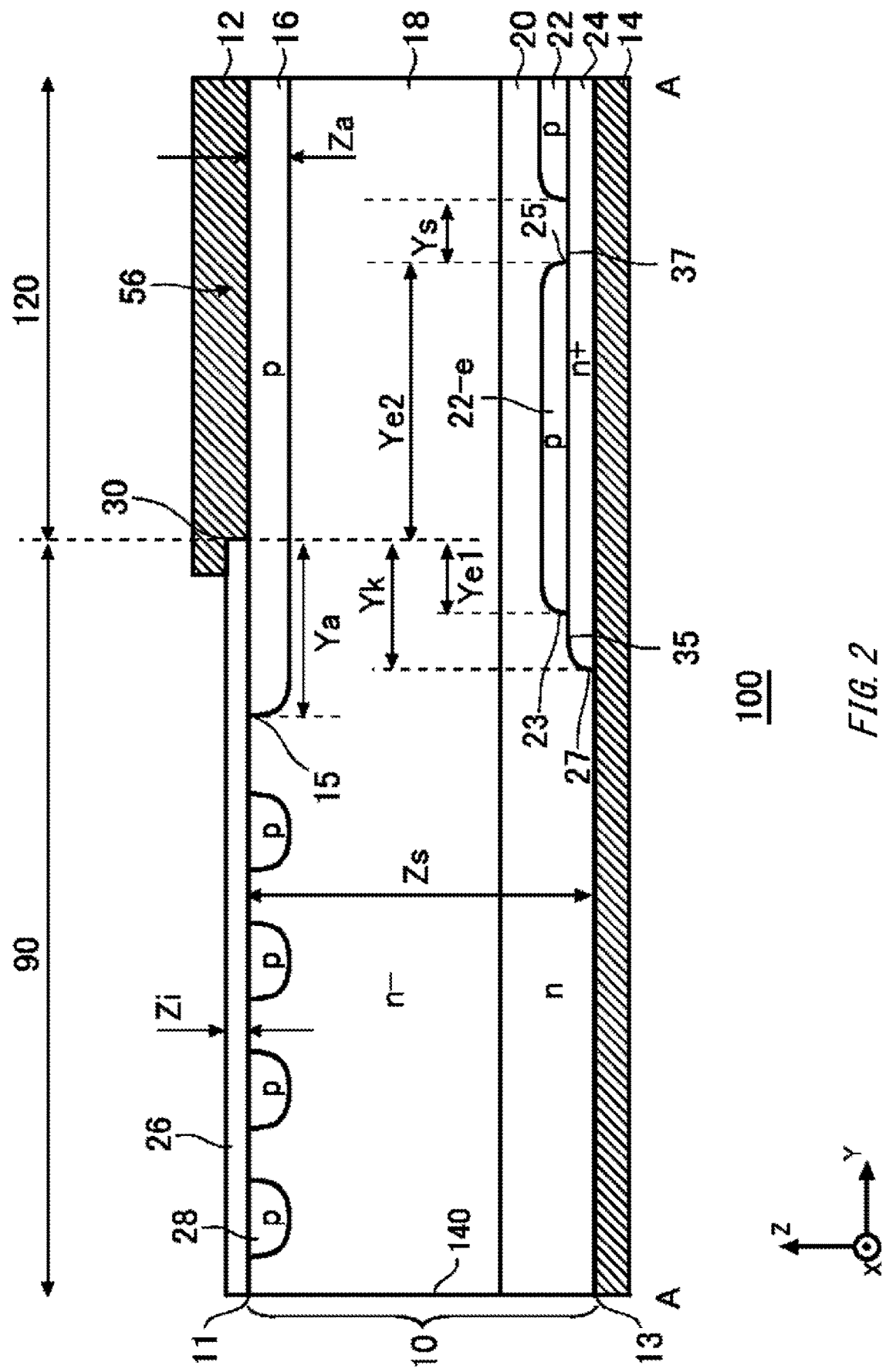
FIG. 2 is a drawing illustrating an example in a cross section along A-A illustrated in FIG. 1.

FIG. 2 is a drawing illustrating an example in a cross section along A-A illustrated in FIG. 1. The cross section A-A is a YZ plane including the active portion 120 and the edge terminal structure portion 90. The Y axis direction in FIG. 2 is an example of a first direction, and a Z axis direction is an example of a second direction. The semiconductor apparatus 100 in this example includes the semiconductor substrate 10, an interlayer dielectric film 26, an anode electrode 12, and a cathode electrode 14 in the cross section. The anode electrode 12 is an example of the upper surface side electrode, and the cathode electrode 14 is an example of the lower surface side electrode.

The interlayer dielectric film 26 is disposed to cover a part of the upper surface of the semiconductor substrate 10. The interlayer dielectric film 26 may be silicate glass such as PSG or BPSG, or may also be an oxide film, a nitride film, or the like. The interlayer dielectric film 26 in this example covers the entire edge terminal structure portion 90. In addition, a contact opening 56 for exposing an upper surface 11 of the semiconductor substrate 10 in at least a part of the region of the active portion 120 is disposed in the interlayer dielectric film 26. In a case where the diode portion is disposed and the transistor portion is not disposed in the active portion 120, the contact opening 56 may be disposed in the entire active portion 120. In this example, the region covered with the interlayer dielectric film 26 arranged in parallel with the outer circumferential end 140 along the outer circumferential end 140 of the semiconductor substrate 10 is set as the edge terminal structure portion 90, and a region that is not covered with the interlayer dielectric film 26 is set as the active portion 120.

The anode electrode 12 is disposed above the upper surface 11 of the semiconductor substrate 10 and in contact with the upper surface 11 of the semiconductor substrate 10 by the contact opening 56. The anode electrode 12 in this example is in contact with an anode region 16 disposed to be exposed to the upper surface 11 of the semiconductor substrate 10. The anode electrode 12 may also be partially disposed on the interlayer dielectric film 26.

The cathode electrode 14 is disposed on the lower surface 13 of the semiconductor substrate 10. The cathode electrode 14 may be in contact with the entire lower surface 13 of the semiconductor substrate 10. The anode electrode 12 and the cathode electrode 14 are formed of a conductive material such as a metal. In the present specification, a direction in which the anode electrode 12 is linked to the cathode electrode 14 is referred to as a depth direction (Z axis direction).

An n− type drift region 18 is disposed in the semiconductor substrate 10. The p type anode region 16 is disposed between the drift region 18 and the upper surface 11 of the semiconductor substrate 10. The anode region 16 is disposed in a region including the upper surface 11 of the semiconductor substrate 10. At least a part of the anode region 16 on the upper surface 11 of the semiconductor substrate 10 is exposed by the contact opening 56 and in contact with the anode electrode 12. A part of the anode region 16 may be covered with the interlayer dielectric film 26. In this example, the anode region 16 is continuously disposed from a region below the contact opening 56 up to a region below the interlayer dielectric film 26 while passing below an end portion 30 of the contact opening 56 in a YZ cross section perpendicular to the upper surface 11 of the semiconductor substrate 10.

It is noted however that the anode region 16 is not disposed in at least a part of the edge terminal structure portion 90 in the cross section. In this example, the end portion 15 of the anode region 16 in the Y axis direction is arranged inside the edge terminal structure portion 90. The end portion 15 may be arranged between the guard ring 28 closest to the active portion 120 among guard rings 28 disposed in the edge terminal structure portion 90 and the end portion 30 of the contact opening 56. The end portion 15 of the anode region 16 may be a boundary between the anode region 16 and the n type region in the upper surface 11 of the semiconductor substrate 10. The anode region 16 may be disposed in the entire active portion 120 or may also be partially disposed.

An n+ type cathode region 24 that has a higher doping concentration than the drift region 18 is disposed between the lower surface 13 of the semiconductor substrate 10 and the drift region 18. The cathode region 24 is disposed in the region including the lower surface 13 of the semiconductor substrate 10. The cathode region 24 is in contact with the cathode electrode 14. At least a part of the cathode region 24 is disposed below the contact opening 56. The cathode region 24 is disposed in the entire active portion 120 in the XY plane or may also be partially disposed. A part of the cathode region 24 is disposed below the interlayer dielectric film 26. In this example, the cathode region 24 is continuously disposed from the region below the contact opening 56 up to the region below the interlayer dielectric film 26 while passing below the end portion 30 of the contact opening 56 in the YZ cross section perpendicular to the upper surface 11 of the semiconductor substrate 10.

It is noted however that the cathode region 24 is not disposed in at least a part of a region of the edge terminal structure portion 90 in the cross section. In the region where the cathode region 24 is not disposed, the drift region 18 may be exposed to the lower surface 13 of the semiconductor substrate 10, and a buffer region 20 that will be described below may also be exposed. In this example, an end portion 27 of the cathode region 24 is arranged inside the edge terminal structure portion 90 in the Y axis direction. The end portion 27 may be arranged between the guard ring 28 closest to the active portion 120 among the guard rings 28 disposed in the edge terminal structure portion 90 and the end portion 30 of the contact opening 56 in the Y axis direction. The end portion 27 of the cathode region 24 may be a portion corresponding to half of the doping concentration with respect to a peak value of the doping concentration in the cathode region 24 on the lower surface 13 of the semiconductor substrate 10.

A p type buried region 22 is disposed above the cathode region 24 inside the semiconductor substrate 10. The buried region 22 may be disposed to be in contact with the cathode region 24. The buried region 22 in this example is arranged while being sandwiched by the cathode region 24 and the buffer region 20 (or the drift region 18 in a case where the buffer region 20 is not disposed) in the Z axis direction.

At least a part of the buried region 22 is disposed below the contact opening 56. The buried region 22 is partially disposed in the active portion 120 in the XY plane. The buried region 22 in this example is arranged at an interval of a predetermined slit width Ys of the active portion 120 in the Y axis direction. In addition, the plurality of buried regions 22 may be arranged at an interval of a predetermined slit width also in the X axis direction. The slit widths in the X axis direction and the Y axis direction may be the same or may also be different from each other.

Among the plurality of buried regions 22, the buried region 22 continuously disposed from the region below the contact opening 56 up to the region below the interlayer dielectric film 26 while passing below the end portion 30 of the contact opening 56 is set as an end portion buried region 22-*e* in the cross section perpendicular to the upper surface 11 of the semiconductor substrate 10. The end portion buried region 22-e may be the buried region 22 closest to the outer circumferential end 140 of the semiconductor substrate 10 in the Y axis direction.

It is noted that the buried region 22 is not in contact with the cathode electrode 14. The entire buried region 22 in this example is disposed on the cathode region 24. An end portion 23 on a side of the outer circumferential end 140 of end portions of the end portion buried region 22-e in the Y axis direction is arranged inside the edge terminal structure portion 90. The end portion 23 may be arranged between the guard ring 28 closest to the active portion 120 among the guard rings 28 disposed in the edge terminal structure portion 90 and the end portion 30 of the contact opening 56 in the Y axis direction. An end portion 25 opposite to the end portion 23 of the end portions of the end portion buried region 22-e in the Y axis direction is arranged inside the active portion 120.

The semiconductor apparatus 100 in this example includes the n type buffer region 20 between the drift region 18 and the lower surface 13 of the semiconductor substrate 10. The cathode region 24 in this example is arranged between the buffer region 20 and the lower surface 13 of the semiconductor substrate 10. The buried region 22 in this example is arranged between the buffer region 20 and the cathode region 24.

The buffer region 20 (or the drift region 18 in a case where the buffer region is not disposed) is exposed to the lower surface 13 of the semiconductor substrate 10 in the region where the cathode region 24 is not disposed. The doping concentration of the buffer region 20 is higher than the doping concentration of the drift region 18. The buffer region 20 may function as a field stop layer that avoids a state where a depletion layer extending from the lower surface side of the anode region 16 reaches the cathode region 24.

The edge terminal structure portion 90 in this example includes one or more guard rings 28. Each of the guard rings 28 is disposed in an annular pattern to surround the active portion 120 in the XY plane. Each of the guard rings 28 may be disposed concentrically in the XY plane. The guard ring 28 in this example is a p type region disposed from the upper surface 11 of the semiconductor substrate 10 up to a location at a predetermined depth. When the guard ring 28 is disposed, the depletion layer extending from a region between the anode region 16 and the drift region 18 can stretch to a surrounding of the outer circumferential end 140 of the semiconductor substrate 10. Accordingly, electric field concentration in an end portion of the active portion 120 can be relaxed.

As illustrated in FIG. 2, when the end portion buried region 22-e that covers the cathode region 24 is disposed below the end portion 30 of the contact opening 56, it is possible to suppress implantation of electrons from the cathode region 24 below the end portion 30. Carriers existing in the drift region 18 or the like of the edge terminal structure portion 90 tend to concentrate in the end portion 30 of the contact opening 56, but when the electron implantation from the region below the end portion 30 is suppressed, the carrier concentration to the end portion 30 can be relaxed.

It is noted that a length Ye1 in the end portion buried region 22-e disposed below the interlayer dielectric film 26 is shorter than a length Ye2 in the end portion buried region 22-e disposed below the contact opening 56 in the Y axis direction. That is, in the end portion buried region 22-e, a part protruding on a side of the active portion 120 in the Y axis direction is longer than a part protruding on a side of the edge terminal structure portion 90 in the Y axis direction when the end portion 30 is set as a reference. Accordingly, a part 37 of the cathode region 24 which is exposed without being covered by the buried region 22 in the active portion 120 has a longer distance from the end portion 30 of the contact opening 56 than a part 35 of the cathode region 24 which is exposed without being covered by the buried region 22 in the edge terminal structure portion 90.

In a case where a forward voltage flows in the semiconductor apparatus 100, electrons are more easily implanted to the part 37 facing the anode electrode 12 of the parts of the cathode region 24 which are exposed without being covered by the buried region 22. When the part 37 is arranged further than the part 35 with respect to the end portion 30 of the contact opening 56, the carrier concentration with respect to the end portion 30 can be relaxed. In addition, when the length Ye1 in the edge terminal structure portion 90 of the end portion buried region 22-e is decreased, it is facilitated to reduce a size of the semiconductor apparatus 100 in the Y axis direction.

The length Ye2 in the active portion 120 in the end portion buried region 22-e may be twice as long as the length Ye1 in the edge terminal structure portion 90 or longer, may be 5 times as long as the length Ye1 or longer, may be 10 times as long as the length Ye1 or longer, or may also be 40 times as long as the length Ye1 or longer. The length Ye2 may be 100 times as short as the length Ye1 or shorter, may be 50 times as short as the length Ye1 or shorter, or may also be 10 times as short as the length Ye1 or shorter. In addition, the length Ye2 may be equal to or larger than a thickness Zs of the semiconductor substrate 10 in the Z axis direction. The length Ye2 may be twice as large as the thickness Zs or larger, or may also be 5 times as long as the thickness Zs or larger.

In addition, the length Ye1 in the end portion buried region 22-e disposed below the interlayer dielectric film 26 in the Y axis direction may be 20 μm or longer. When the length Ye1 is set to be a predetermined length or longer, the part 35 of the cathode region 24 can be set apart with respect to the end portion 30 of the contact opening 56. Accordingly, the carrier concentration to the end portion 30 can be further relaxed. The length Ye1 may be 30 μm or longer, or may also be 40 μm or longer. When the length Ye1 is increased, even in a case where manufacturing variation occurs in photolithography process for forming a mask used when the buried region 22 is formed, it is possible to suppress influences that affect characteristics.

In addition, the length Ye1 in the end portion buried region 22-e disposed below the interlayer dielectric film 26 in the Y axis direction may also be larger than the slit width Ys of the buried region 22 in the Y axis direction. Accordingly, the part 35 of the cathode region 24 can be arranged away from the end portion 30. The length Ye1 may be 1.5 times as large as the slit width Ys or larger, may be twice as large as the slit width Ys or larger, or may also be 3 times as large as the slit width Ys or larger.

In a case where a length in the anode region 16 disposed below the interlayer dielectric film 26 in the Y axis direction is set as Ya, the length Ye1 may be shorter than the length Ya. That is, the end portion buried region 22-e is disposed in a range to be overlapped with the anode region 16 in the edge terminal structure portion 90. The length Ye1 may be 20% of the length Ya or longer, may be 30% of the length Ya or longer, or may also be 40% of the length Ya or longer. The length Ye1 may be 60% of the length Ya or shorter, or may also be 50% of the length Ya or shorter.

In a case where a length in the cathode region 24 disposed below the interlayer dielectric film 26 in the Y axis direction is set as Yk, the length Ye1 may be shorter than the length Yk. That is, the end portion buried region 22-e is disposed in a range to be overlapped with the cathode region 24 in the edge terminal structure portion 90. Accordingly, even in a case where the manufacturing variation or the like occurs, contact of the end portion buried region 22-e with the cathode electrode 14 is avoided.

The length Ye1 may be 20% of the length Yk or longer, may be 30% of the length Yk or longer, or may also be 40% of the length Yk or longer. The length Ye1 may be 80% of the length Yk or shorter, or may also be 70% of the length Yk or shorter. In addition, the length Ye1 may be shorter than the length Yk by 10 μm or more. The length Ye1 may be shorter than the length Yk by 15 μm or more, or may also be shorter than the length Yk by 20 μm or more.

In addition, the length Yk in the cathode region 24 may be shorter than the length Ya of the anode region 16 below the interlayer dielectric film 26. That is, the cathode region 24 is disposed in a range to be overlapped with the anode region 16 in the edge terminal structure portion 90. The length Yk may be half of the length Ya or longer, or may also be 60% of the length Ya or longer. The length Yk may be 80% of the length Ya or shorter, or may also be 70% of the length Ya or shorter. When the end portion 27 of the cathode region 24 is arranged to be closer to a side of the end portion 30 of the contact opening 56 than the end portion 15 of the anode region 16, the carrier concentration to the end portion 15 of the anode region 16 can be relaxed.

In addition, a distance (Ya-Yk) between the end portion 27 of the cathode region 24 and the end portion 15 of the anode region 16 in the Y axis direction may be larger than a thickness Za of the anode region 16 in the Z axis direction. Accordingly, reaching of the carriers implanted from the cathode region 24 to the end portion 15 of the anode region 16 is suppressed, and the carrier concentration in the end portion 15 can be relaxed. The distance (Ya-Yk) may be 1.2 times as large as the thickness Za or larger, may be 1.5 times as large as the thickness Za or larger, or may also be twice as large as the thickness Za or larger. It is noted that the thickness of the anode region 16 immediately below the end portion 30 of the contact opening 56 may be used as the thickness Za of the anode region 16.

In addition, the distance (Ya-Yk) between the end portion 27 of the cathode region 24 and the end portion 15 of the anode region 16 in the Y axis direction may also be larger than a thickness Zi of the interlayer dielectric film 26 in the Z axis direction. The distance (Ya-Yk) may be 1.2 times as large as the thickness Zi or larger, may be 1.5 times as large as the thickness Zi or larger, or may also be twice as large as the thickness Zi or larger. It is noted that the thickness of the interlayer dielectric film 26 immediately above the end portion 15 of the anode region 16 may be used as the thickness Zi of the interlayer dielectric film 26.

Figure 3:
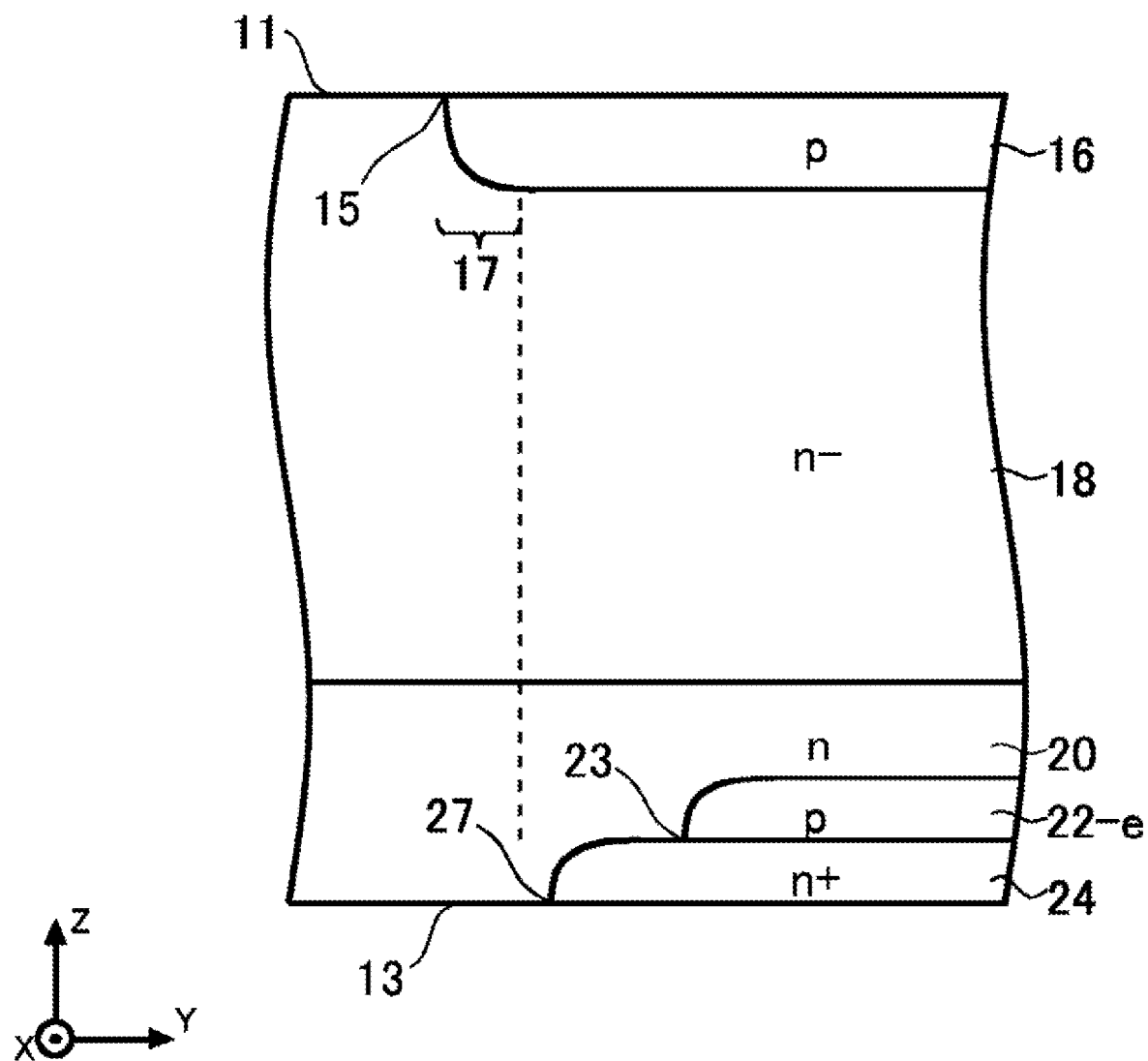
FIG. 3 is a cross sectional view in which a surrounding of an end portion 15 of an anode region 16 is expanded.

FIG. 3 is a cross sectional view in which a surrounding of the end portion 15 of the anode region 16 is expanded. The anode region 16 includes a curved section 17 in the end portion 15 in the YZ cross section. The curved section 17 is a region where a boundary between the anode region 16 and the drift region 18 is a downwardly protruding curved region in the YZ cross section.

In this example, the cathode region 24 is not disposed below the curved section 17. That is, a lower end of the cathode region 24 in the YZ cross section is provided below a region forming a straight line in parallel with the upper surface 11 of the semiconductor substrate 10 in the anode region 16. In accordance with the above-mentioned structure, reaching of the carriers implanted from the cathode region 24 to the curved section 17 is suppressed, and the carrier concentration in the curved section 17 can be relaxed.

Figure 4:
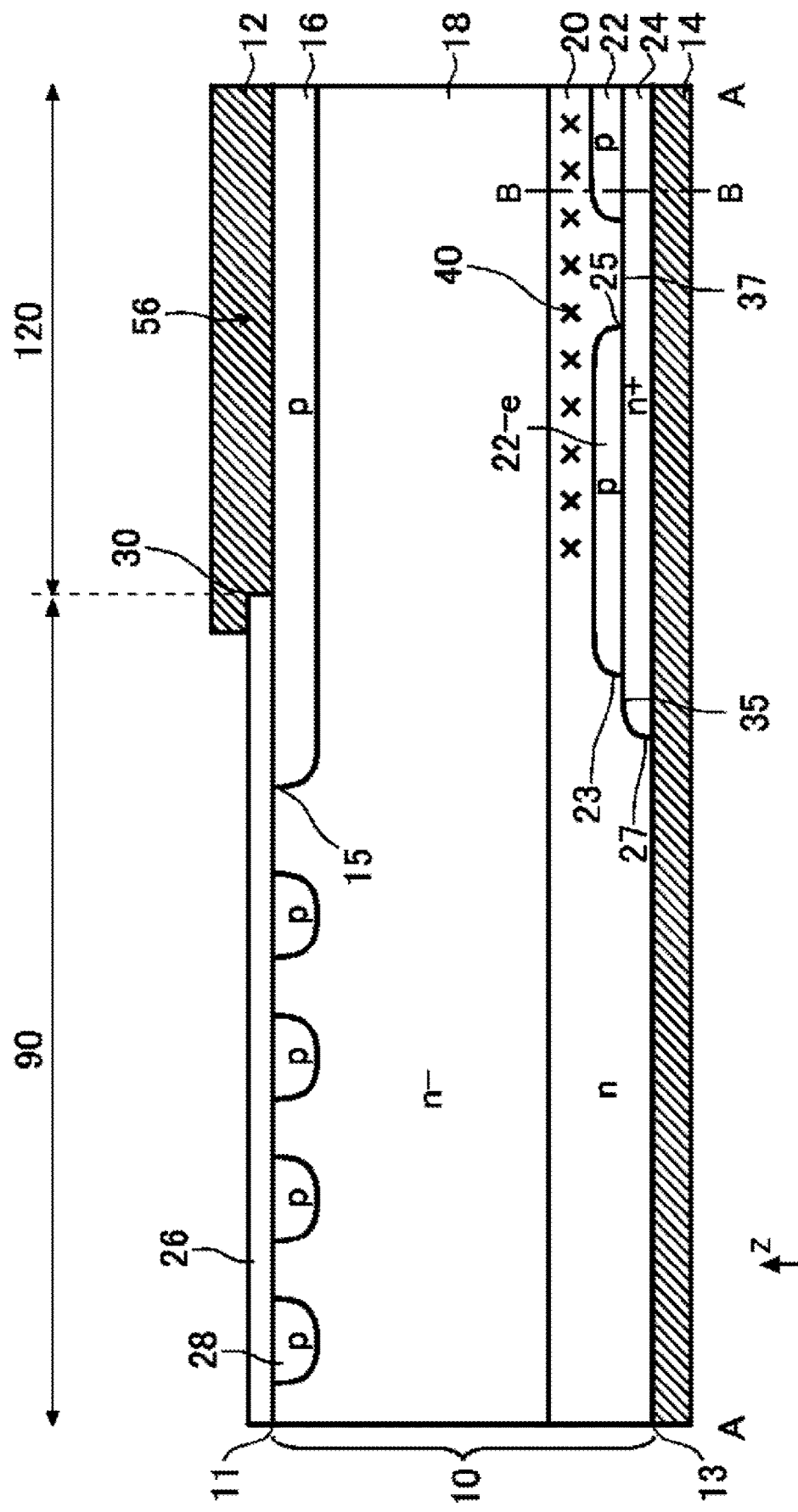
FIG. 4 is a drawing illustrating a YZ cross section of the semiconductor apparatus 100 in another example.

FIG. 4 is a drawing illustrating the YZ cross section in another example of the semiconductor apparatus 100. The semiconductor apparatus 100 in this example includes a lifetime control portion 40 in addition to the components of the semiconductor apparatus 100 described with reference to FIGS. 1 to 3. The lifetime control portion 40 is a region where a density of crystal defects is set to be higher than other regions by locally implanting helium or the like to a predetermined region of the semiconductor substrate 10. When the lifetime control portion 40 is disposed, recombination of carriers derived from the crystal defects is promoted, and a lifetime of the carriers can be adjusted.

The lifetime control portion 40 in this example is disposed inside the buffer region 20 in the Z axis direction and is also disposed inside the active portion 120 in the XY plane. The lifetime control portion 40 may also be further disposed in at least a part of the edge terminal structure portion 90 in the XY plane.

Figure 5:
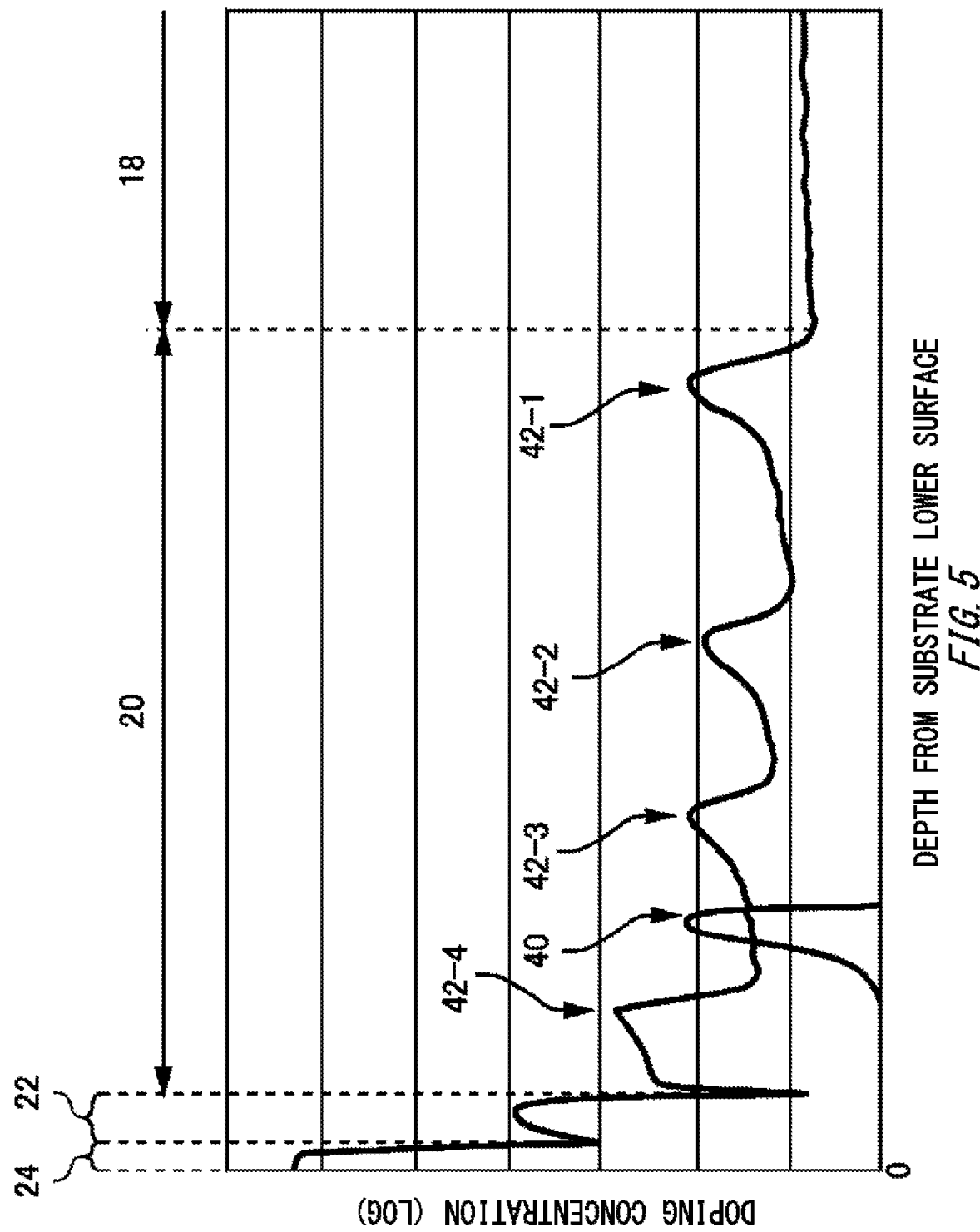
FIG. 5 is a drawing illustrating a doping concentration distribution example in a cross section along B-B illustrated in FIG. 4.

FIG. 5 is a drawing illustrating a doping concentration distribution example in a cross section along B-B illustrated in FIG. 4. FIG. 5 illustrates a peak of the concentration of the crystal defects in the lifetime control portion 40 in addition to the doping concentration. The doping concentration distribution in the buffer region 20 in the Z axis direction in this example has a plurality of peaks 42. The peak of the concentration of the crystal defects in the lifetime control portion 40 is preferably arranged so as not to be overlapped with any one of the peaks 42 in the buffer region 20 in the Z axis direction. Accordingly, excessive recovery of the crystal defects in the lifetime control portion 40 by protons or the like implanted to the buffer region 20 can be suppressed.

It is noted that a state where the peaks of the concentration are not overlapped with each other refers to a state where a distance X between the peaks is equal to or higher than a predetermined value. In one example, the distance X may be a half width at half maximum Y/2 of a crystal defect concentration distribution of the lifetime control portion 40 or larger, may be a full width at half maximum Y or larger, or may also be twice as large as the full width at half maximum Y or larger.

Similarly, it is preferable that the concentration peaks of the lifetime control portion 40 are not overlapped with the peak of the doping concentration of the buried region 22. Accordingly, disappearance of the carriers in the buried region 22 can be suppressed by the lifetime control portion 40.

Figure 6:
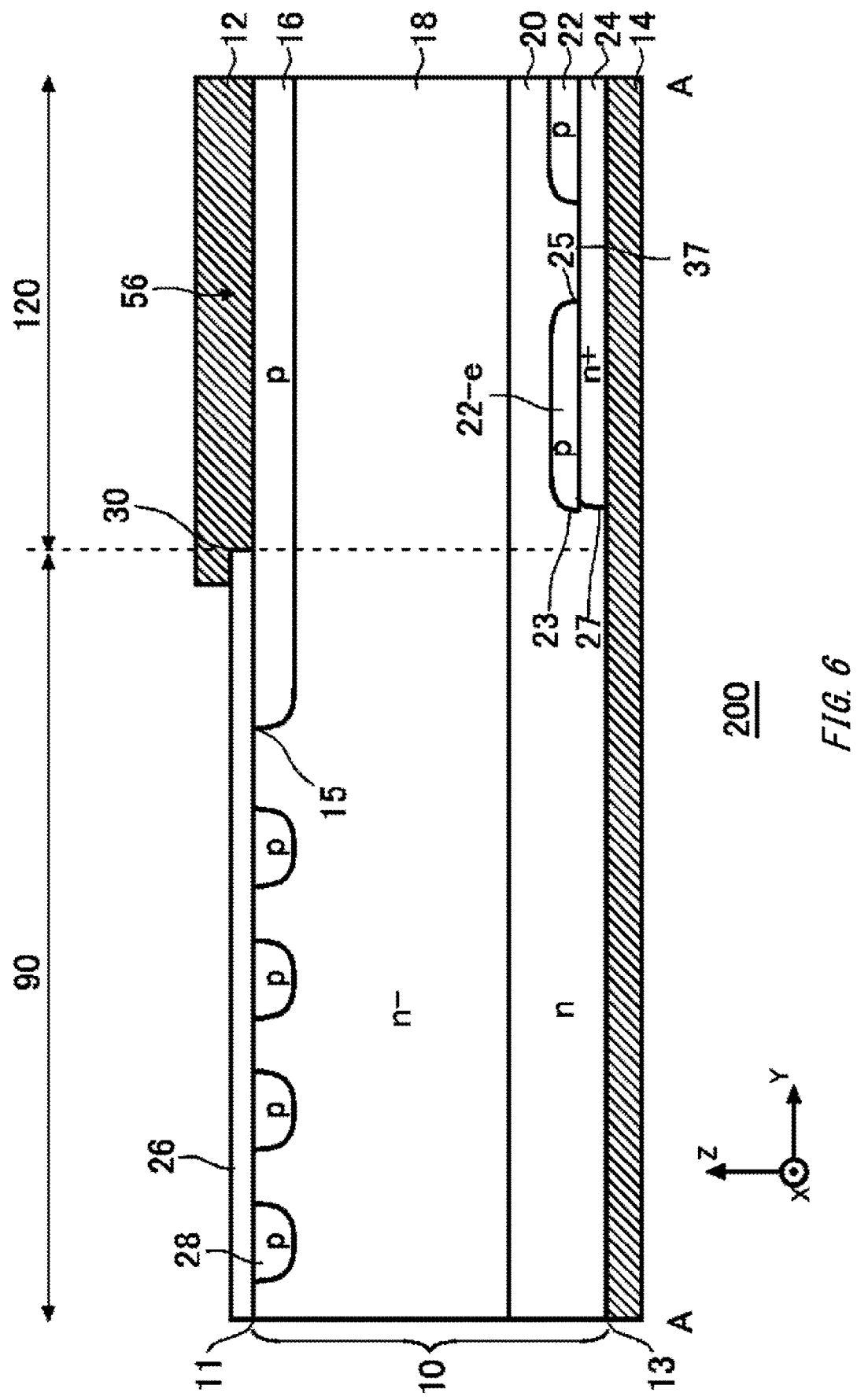
FIG. 6 is a drawing illustrating a structural example of a semiconductor apparatus 200 according to a comparative example.

FIG. 6 is a drawing illustrating a structural example of a semiconductor apparatus 200 according to a comparative example. In the semiconductor apparatus 200, the cathode region 24 and the buried region 22 are disposed below the contact opening 56 and not disposed below the end portion 30 of the contact opening 56 and the interlayer dielectric film 26. When the above-mentioned structure is adopted, the carriers may concentrate in the end portion 30 of the contact opening 56 in some cases. In addition, the end portion 23 of the end portion buried region 22-e and the end portion 27 of the cathode region 24 are disposed in substantially the same positions, and the end portion buried region 22-e becomes more likely to be electrically connected to the cathode electrode 14. When the end portion buried region 22-e and the cathode electrode 14 are set in a short circuit state, the electron implantation from the cathode region 24 is disturbed, and a forward direction current does not flow unless application of a high forward voltage is performed.

Figure 7:
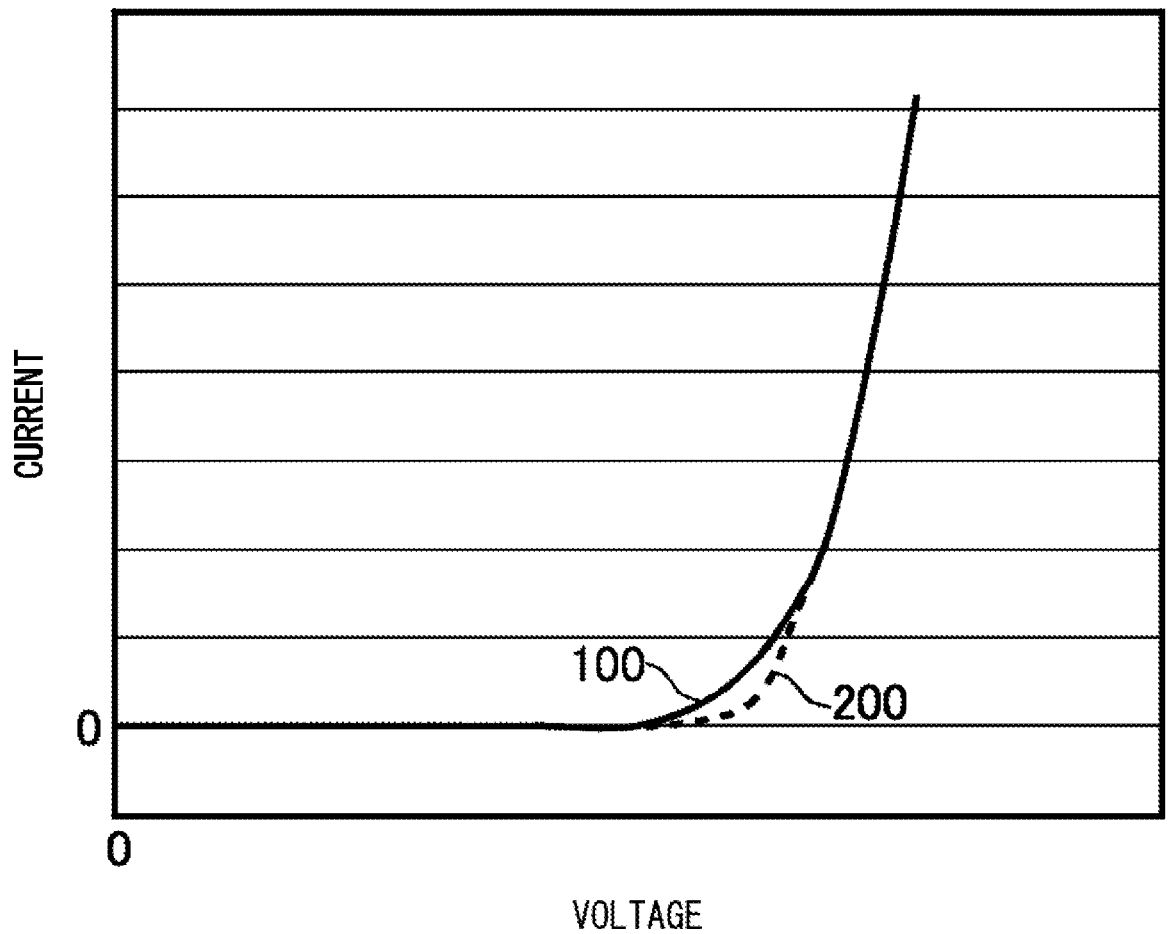
FIG. 7 is a drawing illustrating an example of forward voltage and forward current characteristics of the semiconductor apparatus 100 and the semiconductor apparatus 200.

FIG. 7 illustrates an example of forward voltage and forward current characteristics of the semiconductor apparatus 100 and the semiconductor apparatus 200. In FIG. 7, the characteristic of the semiconductor apparatus 100 is indicated by a solid line, and the characteristic of the semiconductor apparatus 200 is indicated by a broken line.

As illustrated in FIG. 7, according to the characteristic of the semiconductor apparatus 100, a current is raised at a relatively low voltage as compared with the characteristic of the semiconductor apparatus 200. That is, when the end portion 23 of the end portion buried region 22-e is arranged to be closer to the side of the active portion 120 than the end portion 27 of the cathode region 24, an electric resistance between the end portion buried region 22-e and the cathode electrode 14 can be increased, and electrons can be efficiently implanted from the cathode region 24.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor apparatus comprising a semiconductor substrate in which a drift region having a first conductive type is disposed, wherein semiconductor apparatus comprises:
   an anode region having a second conductive type which is disposed between an upper surface of the semiconductor substrate and the drift region;
   a cathode region having the first conductive type which is disposed between a lower surface of the semiconductor substrate and the drift region and has a higher doping concentration than the drift region;
   a buried region having the second conductive type which is disposed above the cathode region;
   an interlayer dielectric film which is arranged above the upper surface of the semiconductor substrate and in which a contact opening for exposing a part of the anode region is disposed; and
   an upper surface side electrode in contact with the anode region in the contact opening, wherein
   the buried region includes an end portion buried region continuously disposed from a region below the contact opening up to a region below the interlayer dielectric film while passing below an end portion of the contact opening in a cross section perpendicular to the upper surface of the semiconductor substrate, and wherein
   the end portion buried region disposed below the interlayer dielectric film is shorter than the end portion buried region disposed below the contact opening in a first direction in parallel with the upper surface of the semiconductor substrate.

2. The semiconductor apparatus according to claim 1, wherein
   a length of the end portion buried region disposed below the interlayer dielectric film in the first direction is 20 μm or longer.

3. The semiconductor apparatus according to claim 1, wherein:
   the buried region is separated in the first direction and disposed at an interval of a predetermined slit width; and
   a length of the end portion buried region disposed below the interlayer dielectric film in the first direction is larger than the slit width.

4. The semiconductor apparatus according to claim 1, wherein:
   the anode region is disposed from the region below the contact opening up to the region below the interlayer dielectric film while passing below the end portion of the contact opening in the cross section perpendicular to the upper surface of the semiconductor substrate; and
   the end portion buried region disposed below the interlayer dielectric film is shorter than the anode region disposed below the interlayer dielectric film in the first direction.

5. The semiconductor apparatus according to claim 1, wherein:
   the cathode region is disposed from the region below the contact opening up to the region below the interlayer dielectric film while passing below the end portion of the contact opening in the cross section perpendicular to the upper surface of the semiconductor substrate; and
   the end portion buried region disposed below the interlayer dielectric film is shorter than the cathode region disposed below the interlayer dielectric film in the first direction.

6. The semiconductor apparatus according to claim 5, wherein
   the end portion buried region disposed below the interlayer dielectric film is shorter than the cathode region disposed below the interlayer dielectric film by 10 μm or more in the first direction.

7. The semiconductor apparatus according to claim 1, wherein:
   the anode region and the cathode region are disposed from the region below the contact opening up to the region below the interlayer dielectric film while passing below the end portion of the contact opening in the cross section perpendicular to the upper surface of the semiconductor substrate; and
   the cathode region disposed below the interlayer dielectric film is shorter than the anode region disposed below the interlayer dielectric film in the first direction.

8. The semiconductor apparatus according to claim 7, wherein
   a length in the cathode region disposed below the interlayer dielectric film is half or more of a length in the anode region disposed below the interlayer dielectric film in the first direction.

9. The semiconductor apparatus according to claim 7, wherein
   a distance between an end portion of the cathode region and an end portion of the anode region in the first direction is larger than a thickness of the anode region in a second direction perpendicular to the upper surface of the semiconductor substrate.

10. The semiconductor apparatus according to claim 7, wherein
    a distance between the end portion of the cathode region and the end portion of the anode region in the first direction is larger than a thickness of the interlayer dielectric film in a second direction perpendicular to the upper surface of the semiconductor substrate.

11. The semiconductor apparatus according to claim 7, wherein:
   the anode region includes a curved section in the end portion in the cross section perpendicular to the upper surface of the semiconductor substrate; and
   the cathode region is not disposed below the curved section.

12. The semiconductor apparatus according to claim 1, wherein a length of the end portion buried region disposed below the contact opening is equal to or larger than a thickness of the semiconductor substrate in the first direction.

\* \* \* \* \*